US009663299B2

(12) United States Patent
Kühnapfel et al.

(10) Patent No.: US 9,663,299 B2
(45) Date of Patent: May 30, 2017

(54) BELT CONVEYOR FOR AN AUTOMATIC PLACEMENT MACHINE AND AUTOMATIC PLACEMENT MACHINE

(71) Applicant: ASM ASSEMBLY SYSTEMS GMBH & CO. KG, Munich (DE)

(72) Inventors: Ralf Kühnapfel, Munich (DE); Arno Stein, Munich (DE)

(73) Assignee: ASM ASSEMBLY SYSTEMS GMBH & CO. KG (DE)

( * ) Notice: Subject to any disclaimer, the term of this patent is extended or adjusted under 35 U.S.C. 154(b) by 0 days.

(21) Appl. No.: 14/706,548

(22) Filed: May 7, 2015

(65) Prior Publication Data

US 2015/0321855 A1   Nov. 12, 2015

(30) Foreign Application Priority Data

May 9, 2014   (DE) .................. 10 2014 106 543

(51) Int. Cl.
| | | |
|---|---|---|
| *H05K 13/04* | (2006.01) | |
| *B65G 23/06* | (2006.01) | |
| *G01D 5/16* | (2006.01) | |
| *B65H 20/20* | (2006.01) | |
| *H05K 13/08* | (2006.01) | |

(52) U.S. Cl.
CPC ............ *B65G 23/06* (2013.01); *B65H 20/20* (2013.01); *G01D 5/16* (2013.01); *H05K 13/0417* (2013.01); *H05K 13/08* (2013.01); *B65G 2203/0266* (2013.01); *B65G 2203/043* (2013.01); *B65G 2811/09* (2013.01); *B65G 2812/02128* (2013.01)

(58) Field of Classification Search
CPC ....... H05K 13/0417; G01D 5/16; B65G 23/06
See application file for complete search history.

(56) References Cited

U.S. PATENT DOCUMENTS

| | | | | | |
|---|---|---|---|---|---|
| 4,620,655 | A | * | 11/1986 | Fujita ................. | H05K 13/0417 |
| | | | | | 221/186 |
| 5,210,489 | A | * | 5/1993 | Petersen ................. | G01V 3/08 |
| | | | | | 324/174 |
| 6,097,183 | A | * | 8/2000 | Goetz .................... | G01D 5/145 |
| | | | | | 324/207.12 |

(Continued)

FOREIGN PATENT DOCUMENTS

| | | |
|---|---|---|
| JP | 11-74689 | 3/1999 |
| JP | 2010-207938 | 9/2010 |

(Continued)

OTHER PUBLICATIONS

Japan Office Action dated Jun. 20, 2016 issued in Japanese Application No. 2015-095506.

*Primary Examiner* — Thomas Randazzo
(74) *Attorney, Agent, or Firm* — Ostrolenk Faber LLP

(57) ABSTRACT

A belt conveyor (10) for an automatic placement machine (50) that includes at least a rotatably mounted pinwheel (12) for conveying a belt (11), a drive (14) with at least one gear wheel (16) for driving the pinwheel (12) and a position-determining device (20) for determining a rotational position of the pinwheel (12), the position-determining device (20) having a first sensor device (30) with at least one magnetoresistive sensor arrangement (31). The disclosure further includes an automatic placement machine (50) having at least one belt conveyor (10).

13 Claims, 3 Drawing Sheets

(56) References Cited

U.S. PATENT DOCUMENTS

| | | | | |
|---|---|---|---|---|
| 6,157,870 | A * | 12/2000 | Gfeller | H05K 13/0417 221/73 |
| 6,650,109 | B1 * | 11/2003 | Reichl | G01D 5/145 324/207.2 |
| 6,879,869 | B2 * | 4/2005 | Kou | H05K 13/08 700/117 |
| 7,119,539 | B2 * | 10/2006 | Butzmann | G01D 5/145 324/207.21 |
| 7,208,940 | B2 * | 4/2007 | Withanawasam | G01D 5/145 324/207.21 |
| 7,795,862 | B2 * | 9/2010 | Doogue | B82Y 25/00 324/207.21 |
| 8,203,332 | B2 * | 6/2012 | Guo | G01D 5/145 324/207.21 |
| 8,575,920 | B2 * | 11/2013 | Ausserlechner | G01D 5/145 324/174 |
| 8,886,471 | B2 * | 11/2014 | Hainz | G01D 5/24452 702/45 |
| 8,988,068 | B2 * | 3/2015 | Ludwig | G01D 5/147 324/207.25 |
| 9,170,309 | B2 * | 10/2015 | Sterling | B82Y 25/00 |
| 9,457,977 | B2 * | 10/2016 | Kawaguchi | H05K 13/0417 |
| 2003/0226873 | A1 * | 12/2003 | Liebeke | H05K 13/0417 226/76 |
| 2010/0097051 | A1 * | 4/2010 | Bussan | G01D 5/145 324/207.21 |
| 2015/0300840 | A1 * | 10/2015 | Haeberle | G01D 5/145 324/207.21 |
| 2015/0369628 | A1 * | 12/2015 | Deak | G01D 5/12 324/207.25 |

FOREIGN PATENT DOCUMENTS

| | | | | |
|---|---|---|---|---|
| JP | EP 2293663 A1 * | 9/2010 | | H05K 14/0417 |
| JP | EP 2293663 A1 * | 3/2011 | | H05K 13/0417 |
| JP | 2011-82500 | 4/2011 | | |
| JP | EP 2293663 A1 * | 9/2011 | | H05K 13/0417 |

* cited by examiner

BELT CONVEYOR FOR AN AUTOMATIC PLACEMENT MACHINE AND AUTOMATIC PLACEMENT MACHINE

CROSS-REFERENCE TO RELATED APPLICATIONS

The present application claims benefit of German Patent Application No. 10 2014 106 543.3, filed May 9, 2014, the content of which is incorporated herein by reference.

TECHNICAL FIELD OF THE INVENTION

The present invention relates to a belt conveyor for an automatic placement machine, at least having a rotatably mounted pinwheel for conveying a belt, a drive with at least one gear wheel for driving the pinwheel and a position-determining device for determining a rotational position of the pinwheel, the position-determining device having a first sensor device with at least one magnetoresistive sensor arrangement. The invention also relates to an automatic placement machine, having at least one belt conveyor.

BACKGROUND OF THE INVENTION

In modern technology, electronic components that are arranged on printed circuit boards are often used. To be able to produce such printed circuit boards in large numbers, it is known to use automatic placement machines. In such automatic placement machines, electronic components are arranged on the printed circuit boards by one or more placement heads. The electronic components required for this are often made available on what are known as component belts, which are fed to the actual placing operation by the placement heads by belt conveyors, which may be part of the automatic placement machines. In such belt conveyors, the transporting of the placed-in belts often takes place by what are known as pinwheels, the pins of which can engage in perforations of the belts. To ensure reliable functioning of the automatic placement machine, in particular to ensure that the placement head of the automatic placement machine can reliably pick up the fed electronic components, great accuracy of the positioning of the fed belt is necessary. It may be necessary here to determine the absolute angular position of the pinwheel of the belt conveyor with an accuracy of ±0.035°.

It is known in the case of belt conveyors to use position-determining devices that have a magnetoresistive sensor arrangement. In such a magnetoresistive sensor arrangement, the AMR effect (anisotropic magnetoresistive effect) for example may be used here for the measurement. It is known here to adhesively attach a magnetized pole wheel, formed in particular as an injection-molded part, directly onto the pinwheel. Even this adhesive attachment of the magnetized pole wheel has to be performed here with high precision. The magnetoresistive sensor arrangement of the position-determining device allows the various magnetic poles of the magnetized pole wheel to be measured, and consequently the position of the pinwheel on which the magnetized pole wheel is adhesively attached to be determined. However, for this purpose it is also necessary that the distance between the magnetoresistive sensor arrangement and the pole wheel must be adjusted very accurately during the mounting of the sensor arrangement. This can be achieved for example by the magnetoresistive sensor arrangement being cast in a casting compound, and the necessary distance between the sensor arrangement and the magnetized pole wheel being set in an iterative process, during the mounting. This set distance must then be ensured for as long as it takes until the casting compound has cured. Altogether, the method and the arrangement of the sensor arrangement for measuring the exact position of the pinwheel according to the prior art, in particular with respect to the mounting, thus represents a very laborious procedure.

SUMMARY OF THE INVENTION

It is therefore the object of the present invention to overcome at least partially the disadvantages described above of known belt conveyors and known automatic placement machines. In particular, it is the object of the present invention to provide a belt conveyor and an automatic placement machine that ensure an exact positional determination of a pinwheel of the belt conveyor, with simple and low-cost mounting of the sensor device necessary for this being made possible in particular.

The aforementioned object is achieved by a belt conveyor and by an automatic placement machine as recited in the claims. Further features and details of the invention are provided by the subclaims, the description and the drawings. Features and details that are described here in conjunction with the belt conveyor according to the invention also apply of course in conjunction with the automatic placement machine according to the invention, and vice versa in each case, so that reference is or can always be made reciprocally with respect to the disclosure of the individual aspects of the invention.

According to a first aspect of the invention, the object is achieved by a belt conveyor for an automatic placement machine, at least having a rotatably mounted pinwheel for conveying a belt, a drive with at least one gear wheel for driving the pinwheel and a position-determining device for determining a rotational position of the pinwheel, the position-determining device having a first sensor device with at least one magnetoresistive sensor arrangement. A belt conveyor according to the invention is characterized in that the first sensor device is assigned to the at least one gear wheel of the drive and is designed for measuring a rotational movement of the at least one gear wheel.

A belt conveyor according to the preamble of claim 1 represents a belt conveyor that can be used as part of an automatic placement machine. The at least one rotatably mounted pinwheel allows a belt to be fed by the belt conveyor to the placement head of the automatic placement machine, it being possible in particular for pins of the pinwheel to engage in perforations of the belt. The pinwheel is moved here by the drive of the belt conveyor. To determine the rotational position of the pinwheel, in the belt conveyor according to the invention there is provided a position-determining device with a sensor device, which has at least one magnetoresistive sensor arrangement. According to the invention, and essential to the invention, it is provided that this first sensor device is assigned to the at least one gear wheel of the drive. The fact that the drive is designed for driving the pinwheel and since the gear wheel is part of the drive means that the movements of the gear wheel and of the pinwheel are directly or at least indirectly connected to one another. A movement of the pinwheel is thus projected onto a movement of the gear wheel, and vice versa. The assignment of the first sensor device to the at least one gear wheel of the drive thus also allows a movement of the pinwheel to be determined directly or at least indirectly. In particular, it is also possible to determine an absolute rotational position of the at least one gear wheel at any time, for example by starting the movement of the at least one gear wheel from a defined rotational position and incrementally measuring the rotational movement of the at least one gear wheel. The reason for this is in particular that the first sensor device is designed for measuring a rotational movement of the at least one gear wheel. The first sensor device may in particular be assigned here to the gear wheel in such a way that the movement of the teeth of the gear wheel in the proximity of the first sensor device, in particular in the proximity of the at least one magnetoresistive sensor arrangement of the first sensor device, is already sufficient for signals that are great enough to be sufficient for measuring the rotational movement of the at least one gear wheel to be generated by the magnetoresistive sensor arrangement. In particular as a result of the assignment of the first sensor device to the at least one gear wheel, it is possible to dispense with the laborious adhesive attachment of a magnetized pole wheel directly to the pinwheel of the belt conveyor. This alone simplifies the mounting of the position-determining device within the belt conveyor. Also, magnets that may be necessary for carrying out the measurement and can preferably be arranged as part of the first sensor device, but also directly on the at least one gear wheel, can be placed further away from the pinwheel than is possible in the case of belt conveyors according to the prior art. Possible influencing of the electronic components arranged on the belt by the magnetic field of such a magnet of the first sensor device can in this way be avoided, or at least significantly reduced. Less influencing of the components in the belt can be ensured as a result, whereby components that can be greatly influenced by magnetic fields can also be used. Altogether, as a result of the use of a sensor device assigned to the at least one gear wheel for measuring a rotational movement of the at least one gear wheel, a belt conveyor according to the invention allows a significant simplification to be achieved in the assembly and production of the belt conveyor as a whole, while at the same time ensuring that the position of the pinwheel of the belt conveyor can be measured exactly.

Furthermore, in the case of a belt conveyor according to the invention, it may be provided that the at least one gear wheel of the drive is fixedly connected to the pinwheel, in particular connected with a material bond, preferably welded. If the gear wheel is far away from the pinwheel mechanically, slight deviations of the gear wheel movement from the pinwheel movement may occur, due for example to mechanical transmission losses. A fixed connection between the at least one gear wheel and the pinwheel allows this to be avoided. A material-bonded connection allows such a fixed connection between the at least one gear wheel of the drive and the pinwheel to be ensured particularly simply. Welding represents a particularly secure material-bonded type of connection here. As a result, particularly good and exact determination of the rotational position of the pinwheel can be achieved by measuring the rotational position of the gear wheel.

A belt conveyor according to the invention may also be designed such that the first sensor device is arranged with respect to the at least one gear wheel in such a way that it is radially assigned to the at least one gear wheel. Consequently, the first sensor device, in particular the at least one magnetoresistive sensor arrangement of the first sensor device, is assigned to a circumferential side of the at least one gear wheel. When there is a rotational movement of the gear wheel, the teeth of the gear wheel are thus moved past the at least one magnetoresistive sensor arrangement of the first sensor device. The teeth of the gear wheel, and the gaps lying between them, thus produce particularly great changes in distance, which are reflected in particularly great and clear signals that are measured by the at least one magnetoresistive sensor arrangement. As a result, great electronic amplifications of the signals can be avoided, or at least are only necessary to a restricted extent. Significantly better signal quality when measuring can be achieved as a result, whereby the precision in the determination of the rotational position of the gear wheel, and consequently of the pinwheel, can also be achieved.

It may be provided particularly preferably in the case of a belt conveyor according to the invention that the at least one magnetoresistive sensor arrangement is designed for measuring a change in an electrical resistance that is produced by the GMR effect. The GMR effect (giant magnetoresistance effect) represents a quantum mechanical effect, in which the electrical resistance of a material depends very significantly on a direction in which magnetic field lines run through this material. The fact that the first sensor device, and in particular the at least one magnetoresistive sensor arrangement of the first sensor device, is assigned to the at least one gear wheel of the drive means that the teeth of the gear wheel move past the first sensor device. Magnetic field lines of a magnet that may for example be arranged preferably in such a way that the at least one magnetoresistive sensor arrangement is located between the gear wheel and the magnet are influenced by the teeth of the gear wheel moved past. By making use of the GMR effect, this influencing can be measured by measuring the electrical resistance. The use of such a magnetoresistive sensor arrangement that is designed for measuring a change in an electrical resistance produced by the GMR effect consequently allows the generation of a particularly good and great signal, reproducing the movement of the gear wheel or its teeth. In particular as a result, it is also possible to dispense with attaching magnets to the gear wheel, for example by adhesively attaching a magnetized pole wheel. The assembly of a belt conveyor according to the invention is further simplified as a result, while at the same time the measuring accuracy can be increased.

It may also be provided in the case of a belt conveyor according to the invention that the first sensor device has two magnetoresistive sensor arrangements turned with respect to one another, in particular turned by 45°. This particularly allows a further increase to be provided in the measuring accuracy that can be achieved by the first sensor device. One reason for this is that the movement of the gear wheel is measured by two magnetoresistive sensor arrangements. This double measurement particularly allows the measuring error to be reduced significantly. Another reason is that the two magnetoresistive sensor arrangements are turned with respect to one another. As a result, the two magnetoresistive sensor arrangements deliver measuring results that are systematically offset with respect to one another, whereby in turn the combined measuring accuracy of the first sensor device can be increased. For example, the two magnetoresistive sensor arrangements may be respectively designed as a Wheatstone bridge circuit, it being possible for the four resistors in each case of the bridge circuits to be turned by 45° with respect to one another. The measuring signals of the two bridge circuits are in this case substantially sinusoidal or co-sinusoidal. A comparison of the two measurements in the evaluation of the measurements has the overall subsequent effect that the position of the gear wheel, and consequently the rotational position of the pinwheel, can be determined particularly accurately.

It may be provided particularly preferably in the case of the belt conveyor according to the invention that the first sensor device has at least one printed circuit board with at least one edge, the at least one magnetoresistive sensor arrangement being arranged on the printed circuit board at a defined distance from the at least one edge and the defined distance having an accuracy of within 0.150 mm, preferably within 0.050 mm. For example, the at least one magnetoresistive sensor arrangement may be placed here at a defined distance of 0.050 mm from the edge, whereby, with the preferred accuracy of within 0.050 mm, it is arranged on the printed circuit board in such a way that it may be arranged flush with the edge, or is arranged at most 0.100 mm away from the edge. In particular, the arrangement of the at least one magnetoresistive sensor arrangement on the printed circuit board of the first sensor device makes it possible for part of the necessary accuracy in the positioning of the sensor device with respect to the gear wheel to be already achieved by the exact placement of the magnetoresistive sensor arrangement on the printed circuit board. The production of such printed circuit boards is a standard process, whereby this necessary accuracy can be achieved particularly simply. In particular the production of the belt conveyor as a whole, in which this accuracy has to be achieved in the placement of the at least one magnetoresistive sensor arrangement with respect to the gear wheel, the production is made easier as a result. A reduction of the costs in the production and assembly of the belt conveyor as a whole can be achieved as a result.

It may be provided particularly preferably in a further development of a belt conveyor according to the invention that the drive has at least one stop face and the first sensor device is arranged in such a way that the at least one edge of the printed circuit board contacts the at least one stop face, in particular that the at least one edge of the printed circuit board is pressed against the at least one stop face. Such a stop face makes the mounting of the first sensor device within the belt conveyor even easier, while at the same time the requirements for the precision of the installation can be met even more easily. The fact that the edge of the printed circuit board contacts the at least one stop face allows the accuracy of the placement of the at least one magnetoresistive sensor arrangement on the printed circuit board also to be transferred to the placement of the first sensor device within the belt conveyor. This can be ensured in particular by pressing the edge of the printed circuit board against the at least one stop face during the mounting of the first sensor device in the belt conveyor. As a result, particularly high precision in the mounting of the first sensor device in the belt conveyor can be achieved particularly simply and reproducibly.

In addition, a belt conveyor according to the invention may be designed such that the position-determining device has a second sensor device for detecting a complete revolution of the at least one gear wheel of the drive and/or of the pinwheel. This makes it possible to detect a complete revolution of the pinwheel in a particularly simple manner. Particularly simple determination of the absolute position of the pinwheel is made possible as a result. In particular, for example, electronics that are used for the evaluation of the sensor signals, both of the first sensor device and of the second sensor device, can be simplified as a result. In particular, the necessity to attach to the pinwheel the magnet that is provided according to the prior art and is necessary for measuring a complete revolution by a Hall probe, can also be avoided. Influencing of the electronic components transported in the belt by magnetic fields can be further reduced as a result.

According to a preferred further development of a belt conveyor according to the invention, it may also be provided that the second sensor device comprises a light sensor, in particular a reflected light barrier. Such a light sensor, in particular a reflected light barrier, represents a particularly simple possibility here for detecting a complete revolution of the gear wheel and/or of the pinwheel. A reflection point adhesively attached to the gear wheel and/or the pinwheel may be used for example for this, in which case the passing of the reflection point in front of the light sensor or the reflected light barrier can be measured. By using a light sensor in particular, measuring of the passing of a complete revolution of the gear wheel or of the pinwheel can be carried out here without influencing the conveyed electronic components.

According to a second aspect of the invention, the object is achieved by an automatic placement machine, having at least one belt conveyor. An automatic placement machine according to the invention is characterized in that the belt conveyor is designed according to the first aspect of the invention. Accordingly, an automatic placement machine according to the invention is accompanied by the same advantages as have been explained in detail with respect to a belt conveyor according to the first aspect of the invention.

BRIEF DESCRIPTION OF THE DRAWINGS

Further advantages, features and details of the invention are provided by the following description, in which exemplary embodiments of the invention are described in detail with reference to the signs. The features mentioned in the claims and in the description may in each case be essential to the invention individually on their own or in any desired combination. Elements with the same function and mode of operation are provided with the same reference signs in the individual figures, in which schematically:

DESCRIPTION OF EMBODIMENTS

Figure 1:
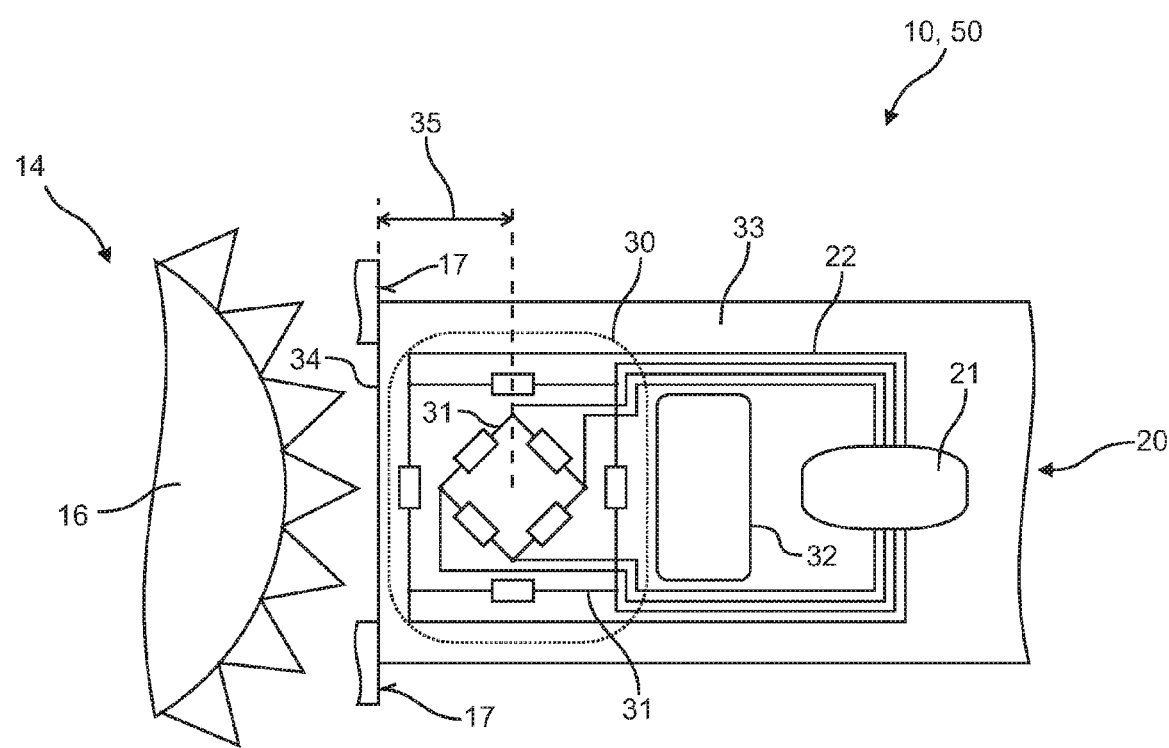
FIG. 1 shows a partial view of a position-determining device of a belt conveyor according to the invention.

FIG. 1 shows part of a belt conveyor 10 according to the invention, which is fitted in an automatic placement machine 50. In particular, parts of a position-determining device 20 are shown. The position-determining device 20 has in particular here a first sensor device 30, which can be seen substantially as printed circuit board 33. Arranged on this printed circuit board 33 are two magnetoresistive sensor arrangements 31, which are respectively designed as Wheatstone bridge circuits. The two magnetoresistive sensor arrangements 31 are arranged here on the printed circuit board 33 in such a way that they are at a defined distance 35 from an edge 34 of the printed circuit board 33. It is provided here that the defined distance 35 is determined with an accuracy of preferably better than 0.050 mm. The two magnetoresistive sensor arrangements 31 are connected by electrical connections 22 to evaluation electronics 21 of the position-determining device 20. In addition, the two magnetoresistive sensor arrangements 31 are arranged on the printed circuit board 33 in such a way that they are located between a magnet 32, likewise arranged on the printed circuit board 33, and a gear wheel 16 of a drive 14 of the belt conveyor 10. As a result, a movement of the gear wheel 16 brings about a change in the magnetic field lines that run from the magnet 32 to the gear wheel 16. The fact that the first sensor device 30 has indeed these two magnetoresistive sensor arrangements 31 means that these changes in the magnetic field lines bring about a change in the electrical resistance of the electrical resistors fitted in the magnetoresistive sensor arrangements 31. This can be measured and evaluated by the evaluation electronics 21, so that the movement of the gear wheel 16 can be measured. It is particularly preferred here that the gear wheel 16 is fixedly connected to a pinwheel 12 of the belt conveyor 10 (not included in the figure), whereby a rotational position of the pinwheel 12 can also be automatically determined at any time. As a result, it can be ensured that components fed in a belt (not included in the figure) to a placement head of the automatic placement machine 50 (not included in the figure) are provided at defined and fixed positions by the belt conveyor 10. In addition, in the embodiment of a belt conveyor 10 according to the invention that is depicted, the drive 14 has two stop faces 17. The printed circuit board 33 of the first sensor device 30 is placed here in the belt conveyor 10 in such a way that the edge 34 of the printed circuit board 33 is pressed against these two stop faces 17. As a result, it can be ensured that the accurate positioning of the magnetoresistive sensor arrangements 31 that is ensured by the defined distance 35 can also be transferred to an accurate positioning of the first sensor device 30 as a whole with respect to the gear wheel 16 of the drive 14. Particularly accurate and reliable measurement of the rotational position of the gear wheel 16 can be ensured particularly simply as a result. Laborious adhesive-bonding operations or the encapsulation of the printed circuit board 33 with a casting compound and stabilization of the printed circuit board 33 for as long as it takes until the casting compound cures can be avoided as a result.

Figure 2:
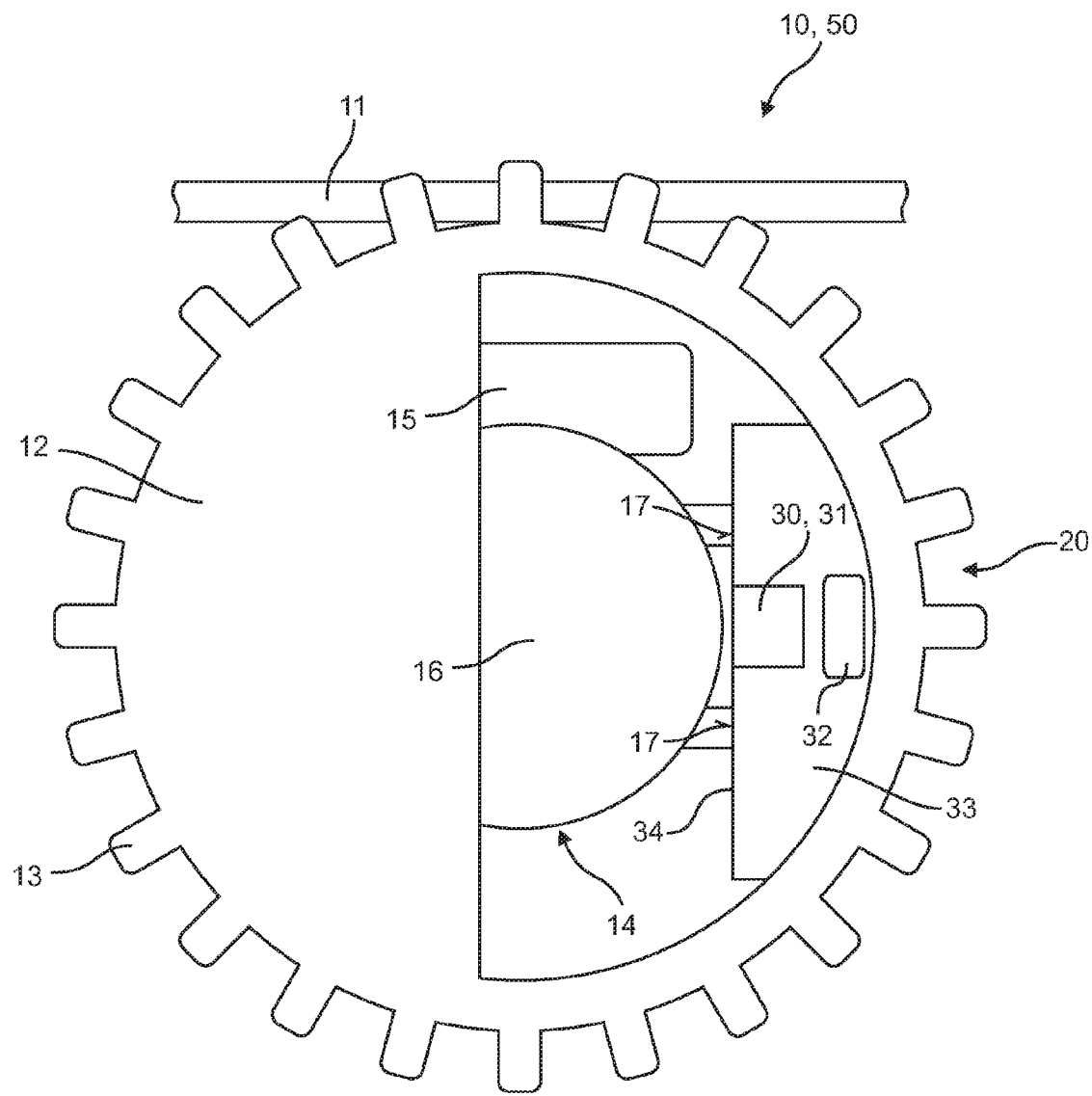
FIG. 2 shows a partial view of a belt conveyor according to the invention and FIG. 3 shows a sectional view of part of a belt conveyor according to the invention.

FIG. 2 shows a further view of a belt conveyor 10 according to the invention, which is fitted in an automatic placement machine 50. In particular, in this figure the pinwheel 12 can also be seen. For better clarity of what is shown, the middle portion of the pinwheel 12 is partially hidden. The pins 13 of the pinwheel 12, of which only a single pin 13 is provided with a reference sign, are designed for engaging in perforations of the belt 11. When there is a movement of the pinwheel 12, the belt 11 is consequently moved further, whereby the electronic components arranged on the belt 11 can be successively fed to a placement head of the automatic placement machine 50 (not included in the figure). The drive 14 of the belt conveyor 10 is intended here for driving the pinwheel 12. It has for example a worm wheel 15, by which a gear wheel 16 is driven. The gear wheel 16 is preferably fixedly connected here to the pinwheel 12, in particular welded. When there is a movement of the gear wheel 16, the pinwheel 12 is thus also automatically moved, the two movements particularly being connected directly to one another and projected one onto the other. Furthermore, the drive 14 has two stop faces 17, against which an edge 34 of a printed circuit board 33 of a first sensor device 30 can be pressed. Also arranged on this printed circuit board 33 is at least one magnetoresistive sensor arrangement 31. The magnetoresistive sensor arrangement 31 may be arranged here on the printed circuit board 33 in such a way that a defined distance 35 (not included in the figure) from the edge 34 is maintained. As a result, particularly accurate placement of the magnetoresistive sensor arrangement 31 on the printed circuit board can be achieved. The contacting, in particular the pressing of the edge 34 against the stop faces 17, allows this accurate placement of the magnetoresistive sensor arrangement 31 also to be achieved with respect to the gear wheel 16. A particularly accurate measurement of the rotational movement of the gear wheel 16 by the first sensor device 30, in particular the magnetoresistive sensor arrangement 31 of the first sensor device 30, can be achieved as a result. In addition, it can also be seen that the magnetoresistive sensor arrangement 31 is arranged between a magnet 32 on the printed circuit board 33 and the gear wheel 16. Magnetic field lines of the magnet 32 are changed by the movement of the gear wheel 16, it being possible for this change to be measured by the magnetoresistive sensor arrangement 31. An accurate determination of the rotational position of the gear wheel 16 is thus possible at any time. In particular, the absolute position of the gear wheel 16 can also be determined, for example by evaluation of the teeth of the gear wheel 16 that have already moved past and starting in a defined zero position of the gear wheel 16. Of course, a second sensor device 40 (not included in the figure) may also be provided, in order indeed to determine the defined passing through zero of the gear wheel 16 or of the pinwheel 12.

In FIG. 2, the first sensor device 30 has two magnetoresistive sensor arrangements 31 turned with respect to one another by 45°. This allows a further increase in the measuring accuracy that can be achieved by the first sensor device 30 to be provided. This means that the movement of the gear wheel 16 is measured by two magnetoresistive sensor arrangements 31 turned in relation to one another. This double measurement allows the measuring error to be significantly reduced. The turning of the two magnetoresistive sensor arrangements 31 with respect to one another, in particular by 45°, allows the two magnetoresistive sensor arrangements 31 to deliver measuring results that are systematically offset with respect to one another, whereby in turn the combined measuring accuracy of the first sensor device 30 can be increased. Preferably, the two magnetoresistive sensor arrangements 31 are respectively designed as a Wheatstone bridge circuit, it being possible for the four resistors in each case of the bridge circuits to be turned by 45° with respect to one another. The measuring signals of the two bridge circuits are in this case substantially sinusoidal or co-sinusoidal. A comparison of the two measurements in the evaluation of the measurements has the overall subsequent effect that the position of the gear wheel 16, and consequently the rotational position of the pinwheel 12, can be determined particularly accurately.

Figure 3:
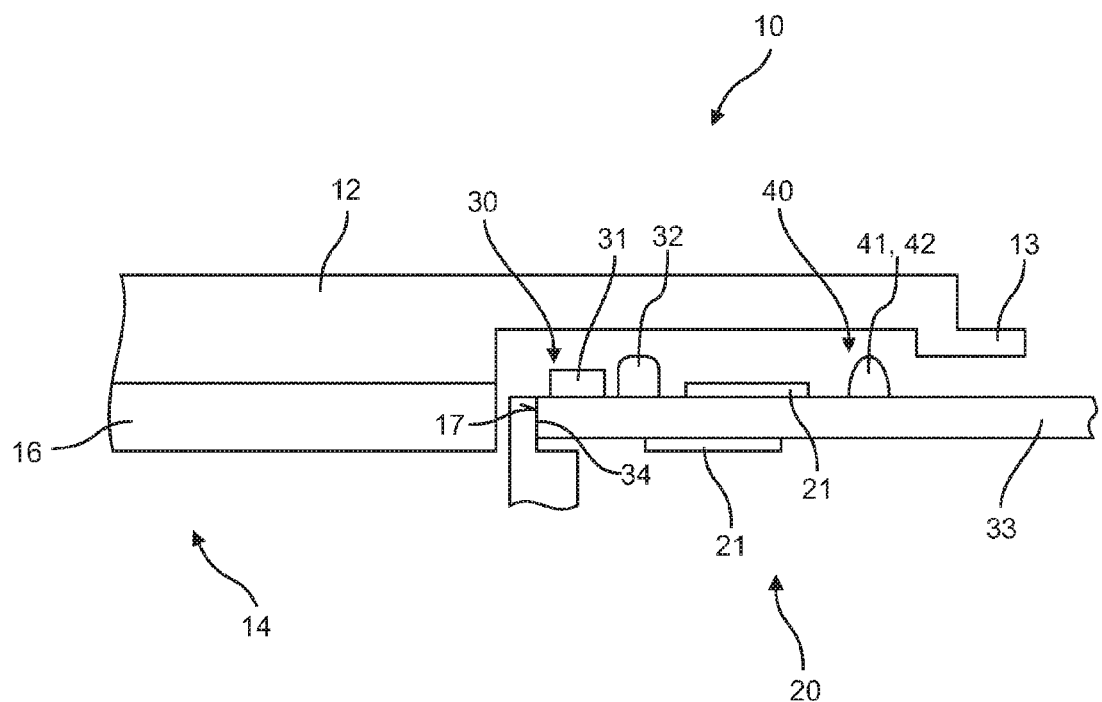

In FIG. 3, a sectional view of a further embodiment of a belt conveyor 10 according to the invention is shown. Here it can be clearly seen in particular that the gear wheel 16 and the pinwheel 12 are fixedly connected to one another. The pins 13 of the pinwheel 12 are located at the outer periphery of the pinwheel 12. Apart from the drive 14, a position-determining device 20 is also shown. The position-determining device 20 has in particular here a first sensor device 30 with a magnetoresistive sensor arrangement and a magnet 32. These components of the first sensor device 30 are arranged here on a printed circuit board 33, in particular at a defined distance 35 (not included in the figure) from an edge 34 of the printed circuit board. This edge 34 of the printed circuit board is in turn pressed against a stop face 17 of the drive 14. Accurate positioning, particularly of the magnetoresistive sensor arrangement 31 with respect to the gear wheel 16, can be achieved as a result. In addition, along with evaluation electronics 21, the position-determining device 20 also has a second sensor device 40. This second sensor device 40 comprises in particular a light sensor 41 designed as a reflected light barrier 42. This light sensor 41 is designed for observing the pinwheel 12, it being possible for example for a matt-black label to be adhesively attached on the pinwheel 12 as a reflection object. When there is a movement of this reflection point over the reflected light barrier 42, a complete revolution of the pinwheel 12 can thus be determined. As a result, particularly simple determination of a complete revolution of the pinwheel 12 can be achieved, and on that basis, together with the measurement of the magnetoresistive sensor arrangement 31 on the gear wheel 16, determination of the absolute position of the pinwheel 12.

LIST OF REFERENCE SIGNS AND SYMBOLS

10 Belt conveyor
11 Belt
12 Pinwheel
13 Pin
14 Drive
15 Worm wheel
16 Gear wheel
17 Stop face
20 Position-determining device
21 Evaluation electronics
22 Electrical connection
30 First sensor device
31 Magnetoresistive sensor arrangement
32 Magnet
33 Printed circuit board
34 Edge
35 Defined distance
40 Second sensor device
41 Light sensor
42 Reflected light barrier
50 Automatic placement machine The above list is an integral part of the description.

What is claimed is:

1. Belt conveyor for an automatic placement machine, the belt conveyor comprising:
    a rotatably mounted pinwheel for conveying a belt,
    a drive with at least one gear wheel for driving the pinwheel and
    a position-determining device for determining a rotational position of the pinwheel, the position-determining device having a first sensor device with at least one magnetoresistive sensor arrangement,
    wherein the first sensor device is assigned to the at least one gear wheel of the drive and is designed for measuring a rotational movement of the at least one gear wheel; and
    the at least one gear wheel of the drive is fixedly connected to the pinwheel with a material bond.

2. Belt conveyor according to claim 1, wherein the at least one gear wheel of the drive is welded to the pinwheel.

3. Belt conveyor according to claim 1, wherein the first sensor device is arranged with respect to the at least one gear wheel in such a way that it is radially assigned to the at least one gear wheel.

4. Belt conveyor according to claim 1, wherein the at least one magnetoresistive sensor arrangement is designed for measuring a change in an electrical resistance that is produced by a GMR effect.

5. Belt conveyor according to claim 1, wherein the first sensor device has two magnetoresistive sensor arrangements turned with respect to one another.

6. Belt conveyor according to claim 5, wherein the first sensor device has two magnetoresistive sensor arrangements turned with respect to one another by 45°.

7. Belt conveyor according to claim 1, wherein the position-determining device has a second sensor device for detecting a complete revolution of at least one of the at least one gear wheel of the drive and of the pinwheel.

8. Belt conveyor according to claim 7, wherein the second sensor device comprises a light sensor.

9. Belt conveyor according to claim 8, wherein the light sensor is a reflected light barrier.

10. Belt conveyor for an automatic placement machine, at least having a rotatably mounted pinwheel for conveying a belt, a drive with at least one gear wheel for driving the pinwheel and a position-determining device for determining a rotational position of the pinwheel, the position-determining device having a first sensor device with at least one magnetoresistive sensor arrangement,
    wherein the first sensor device is assigned to the at least one gear wheel of the drive and is designed for measuring a rotational movement of the at least one gear wheel and the first sensor device has at least one printed circuit board with at least one edge, the at least one magnetoresistive sensor arrangement being arranged on the printed circuit board at a defined distance from the at least one edge and the defined distance having an accuracy of within 0.150 mm.

11. Belt conveyor according to claim 10, wherein the drive has at least one stop face and the first sensor device is arranged in such a way that the at least one edge of the printed circuit board contacts the at least one stop face, in particular in that the at least one edge of the printed circuit board is pressed against the at least one stop face.

12. Belt conveyor according to claim 10, wherein the defined distance has an accuracy of within 0.050 mm.

13. Automatic placement machine, having at least one belt conveyor, wherein the belt conveyor is designed according to claim 1.

* * * * *